(12) United States Patent
Barth, Jr. et al.

(10) Patent No.: US 9,343,185 B2
(45) Date of Patent: May 17, 2016

(54) ELECTRONIC CIRCUIT FOR FITTING A VIRTUAL ADDRESS RANGE TO A PHYSICAL MEMORY CONTAINING FAULTY ADDRESS

(71) Applicant: International Business Machines Corporation, Armonk, NY (US)

(72) Inventors: John E. Barth, Jr., Williston, VT (US); Srivatsan Chellappa, Tempe, AZ (US); Dean L. Lewis, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 251 days.

(21) Appl. No.: 14/037,487

(22) Filed: Sep. 26, 2013

(65) Prior Publication Data

US 2015/0089329 A1  Mar. 26, 2015

(51) Int. Cl.
*G06F 12/00* (2006.01)
*G11C 29/00* (2006.01)
*G06F 9/445* (2006.01)
(Continued)

(52) U.S. Cl.
CPC *G11C 29/76* (2013.01); *G06F 8/65* (2013.01); *G06F 9/328* (2013.01); *G06F 11/1008* (2013.01); *G06F 12/04* (2013.01); *G06F 12/0638* (2013.01); *G06F 12/0868* (2013.01); *G06F 12/0886* (2013.01); *G06F 12/109* (2013.01); *G06F 12/1027* (2013.01); *G06F 12/126* (2013.01); *G06F 13/225* (2013.01);
(Continued)

(58) Field of Classification Search
CPC . G06F 11/1008; G06F 12/04; G06F 12/0638; G06F 12/0868; G06F 12/0886; G06F 12/109; G06F 13/225; G06F 13/385

USPC ........ 711/108, 144, 206, 210, 212, 225, 226; 710/26, 33, 55, 307, 310; 712/225, 712/226; 713/340, 501; 714/4.3, 6.13, 21
See application file for complete search history.

(56) References Cited

U.S. PATENT DOCUMENTS 5,406,565 A   4/1995  MacDonald
5,438,559 A   8/1995  Best et al.
(Continued)

OTHER PUBLICATIONS

Liviu Agnola et al., "Self-Adaptive Mechanism for Cache Memory Reliability Improvement", Department of Computer Science "Politehnica" University Timisoara, Romania, pp. 117-118, 2010.
(Continued)

*Primary Examiner* — Reba I Elmore
(74) *Attorney, Agent, or Firm* — Gibb & Riley, LLC; Steven J. Meyers, Esq.

(57) ABSTRACT

A memory having variable size blocks of failed memory addresses is connected to a TCAM storing data values of ranges of addresses in the memory. The ranges of addresses correspond to virtual addresses that, in combination with an offset, point away from failed memory addresses. A reduction circuit connected to the TCAM produces an output for each programmed range of addresses based on a virtual address. A priority encoder, connected to the reduction circuit, selects a first range from the reduction circuit and passes the first range to a random-access memory (RAM). Responsive to the virtual address bring an address in one of the ranges of addresses, the priority encoder passes the first range containing the virtual address to the RAM, which passes a corresponding offset value to the Adder based on the first range. The Adder calculates a physical memory address directing the virtual address to a functional memory location.

20 Claims, 16 Drawing Sheets

(51) Int. Cl.
*G06F 9/32* (2006.01)
*G06F 12/08* (2016.01)
*G06F 11/10* (2006.01)
*G06F 12/12* (2016.01)
*G06F 12/06* (2006.01)
*G06F 13/22* (2006.01)
*G06F 13/38* (2006.01)
*G06F 12/10* (2016.01)
*G06F 12/04* (2006.01)
*G11C 15/00* (2006.01)
*G11C 8/06* (2006.01)

(52) U.S. Cl.
CPC ............... *G06F 13/385* (2013.01); *G11C 8/06* (2013.01); *G11C 15/00* (2013.01)

(56) References Cited

U.S. PATENT DOCUMENTS

| | | | |
|---|---|---|---|
| 5,831,913 A | 11/1998 | Kirihata | |
| 5,831,914 A | 11/1998 | Kirihata | |
| 5,848,009 A | 12/1998 | Lee et al. | |
| 5,881,003 A | 3/1999 | Kirihata et al. | |
| 5,940,335 A | 8/1999 | Kirihata | |
| 5,978,931 A | 11/1999 | Kirihata et al. | |
| 6,243,306 B1 | 6/2001 | Kirihata | |
| 6,414,885 B2 | 7/2002 | Nagamatsu et al. | |
| 6,678,836 B2 | 1/2004 | Driscoll | |
| 6,809,973 B2 | 10/2004 | Lee | |
| 7,281,085 B1 * | 10/2007 | Garg | G11C 15/00 370/235 |
| 7,405,985 B2 | 7/2008 | Cernea et al. | |
| 7,447,066 B2 | 11/2008 | Conley et al. | |
| 7,966,518 B2 | 6/2011 | Bosch et al. | |
| 8,879,295 B1 * | 11/2014 | Barth et al. | 365/49.17 |
| 9,256,548 B2 * | 2/2016 | Steiss | G06F 12/1009 |
| 2003/0179631 A1 | 9/2003 | Koob et al. | |
| 2005/0081093 A1 | 4/2005 | Joly et al. | |
| 2007/0028039 A1 * | 2/2007 | Gupta et al. | 711/108 |
| 2012/0266016 A1 | 10/2012 | Huang | |
| 2014/0219279 A1 * | 8/2014 | Gross | H04L 45/745 370/392 |

OTHER PUBLICATIONS

Christoforos N. Hadjicosti, "Fault-Tolerant Discrete-Time Linear Time-Invariant Filters", University of Illinois at Urbana-Champaign 148 C&SRL, 1308 West Main Street Urbana, IL 61 801, pp. 3311-3314, 2000.

* cited by examiner

ELECTRONIC CIRCUIT FOR FITTING A VIRTUAL ADDRESS RANGE TO A PHYSICAL MEMORY CONTAINING FAULTY ADDRESS

BACKGROUND

The present disclosure relates to fault-tolerant memory in integrated electronic circuits, and more specifically, to systems and methods to map variable sized groups of faulty addresses to good addresses such that the memory space appears contiguous.

A memory chip with even a single failed array cannot be sold, which significantly degrades product yield. A known solution is to provide spare arrays to replace the failed ones. There are two problems with this solution. First, as memory size grows, the cost of providing a spare memory array increases and the effectiveness decreases; for 3-D stacked memories, a spare memory array will not suffice. Second, a spare memory array is almost entirely useless in recovering from memory architecture faults (e.g. faults in the address and data buses); for 3-D memories, faults in the 3-D interconnect are a serious risk.

SUMMARY

Methods and systems herein map a virtual address space to a larger physical memory containing faults by redirecting ranges of virtual addresses to ranges of good memory locations within the physical memory. By mapping around failed memory locations, methods and systems herein avoid the cost and limitations of providing spare memory arrays. Methods and systems herein have the flexibility to work at any granularity (wordline, subarray, macro, 3-D stratum, etc.), which allows recovery from memory architecture faults. Such recovery may be accomplished by using a Ternary Content Addressable Memory (TCAM) to match failed address ranges and redirect addresses in those ranges to good memory locations.

According to an integrated circuit structure, a memory under repair having variable size blocks of failed memory addresses is operatively connected to a Ternary Content Addressable Memory (TCAM) comprising cells storing data values comprising ranges of addresses. The ranges of addresses correspond to virtual addresses that, in combination with an offset, point away from the failed memory addresses in the memory under repair. A reduction circuit is operatively connected to the TCAM. The reduction circuit produces a single output for each programmed range of the ranges of addresses based on a virtual address input to the TCAM. A priority encoder is operatively connected to the reduction circuit. The priority encoder selects a first programmed range from the reduction circuit. A random-access memory (RAM) is operatively connected to the priority encoder. The RAM comprises cells storing data values comprising offset values for the ranges of addresses. An Adder in the integrated circuit device has two inputs. A first input is operatively connected to the RAM and a second input is operatively connected to a virtual address line. Responsive to the virtual address being an address in one of the ranges of addresses, the priority encoder passes the first programmed range containing the virtual address to the RAM, the RAM passes an offset value to the Adder that corresponds to the first programmed range from the priority encoder, and the Adder calculates a physical memory address, directing the virtual address to a functional memory location in the memory under repair.

According to a computer-implemented method herein, a Ternary Content Addressable Memory (TCAM) is configured with data values comprising ranges of addresses in a memory under repair having variable size blocks of failed memory addresses, using a computerized device. The ranges of addresses correspond to virtual addresses that, in combination with an offset, point away from the failed memory addresses in the memory under repair. A virtual address is received, using the computerized device. At least a portion of the virtual address is applied to the TCAM, using the computerized device. A match is identified in the TCAM indicating the virtual address is in at least one range of the ranges of addresses, using the computerized device. A single output is produced for each programmed range of the ranges of addresses, based on the virtual address, using the computerized device. A first programmed range is selected, using the computerized device. The first programmed range is passed to a random-access memory (RAM), using the computerized device. An offset value is output from the RAM as a first input to an Adder, using the computerized device. The offset value corresponds to the first programmed range. The virtual address is applied as a second input to the Adder, using the computerized device. The virtual address is mapped to a physical address for a functional memory address in the memory under repair, using the computerized device.

A system herein comprises a memory under repair having variable size blocks of failed memory addresses and a Ternary Content Addressable Memory (TCAM) comprising cells storing data values comprising ranges of addresses. A reduction circuit is operatively connected to the TCAM. A priority encoder is operatively connected to the reduction circuit. A random-access memory (RAM) is operatively connected to the priority encoder. The RAM comprises cells storing data values comprising an offset value for each range of the ranges of addresses. The system includes a processor. The processor identifies ranges of addresses in the memory under repair. The ranges of addresses correspond to virtual addresses that, in combination with an offset, point away from the failed memory addresses in the memory under repair. The processor identifies unused functional memory locations in the memory under repair. The processor receives a virtual address and produces a single output for each programmed range of the ranges of addresses, using the reduction circuit. The processor selects a first programmed range from the reduction circuit, using the priority encoder, based on the virtual address. The processor calculates a physical memory address in an unused functional memory location in the memory under repair for the virtual address. And, the processor directs the virtual address to the physical memory address in the unused functional memory location. The TCAM may be organized as a Ternary Content Addressable Memory (TCAM) and the RAM may be organized as a random-access memory (RAM).

BRIEF DESCRIPTION OF THE DRAWINGS

The systems and methods herein will be better understood from the following detailed description with reference to the drawings, which are not necessarily drawn to scale and in which:

FIG. 5 is a block diagram illustrating examples of TCAM entries according to systems and methods herein;

FIG. 6 is a block diagram illustrating an example of RAM entries according to systems and methods herein;

DETAILED DESCRIPTION

Figure 1:
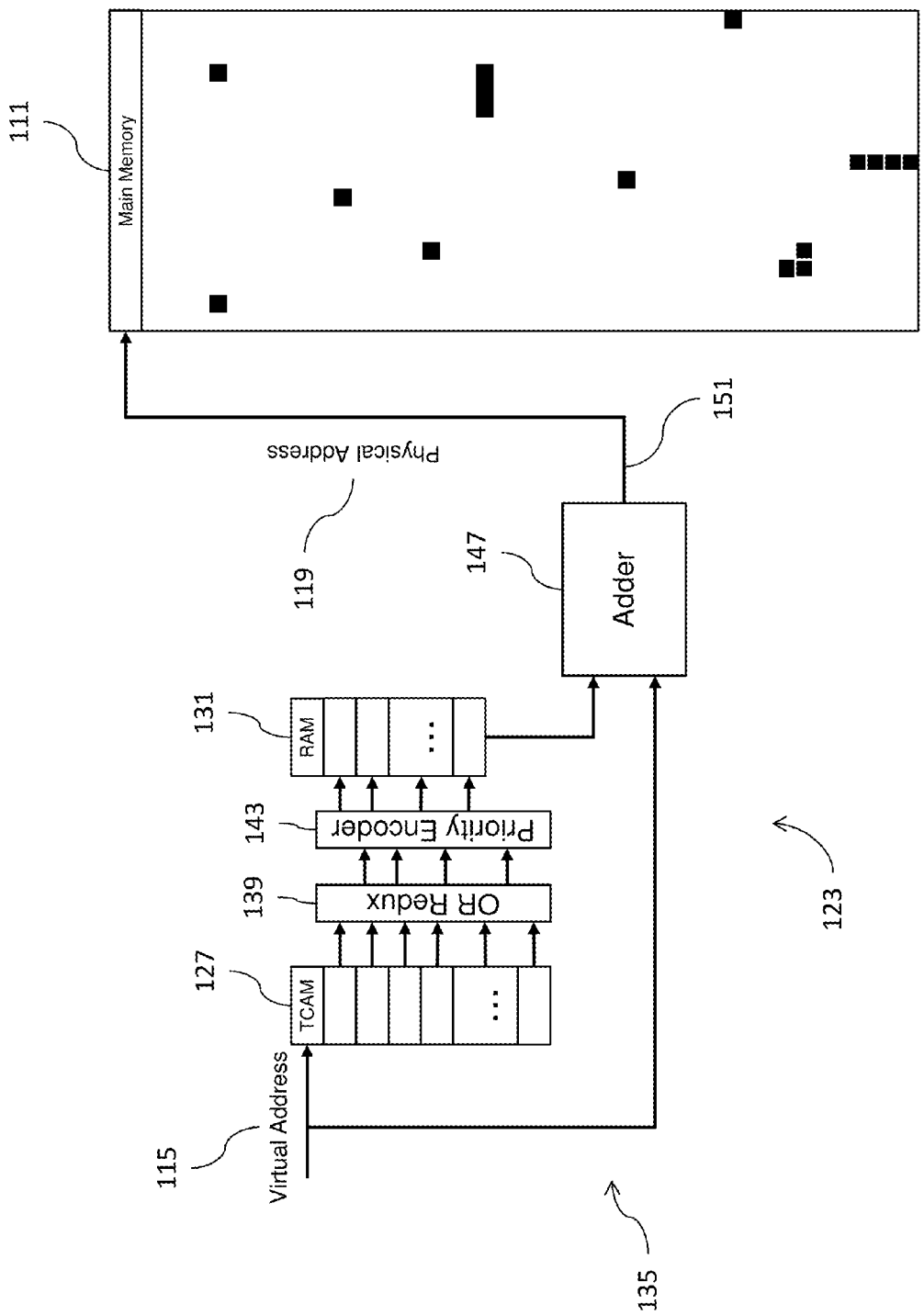
FIG. 1 is a system overview illustrating various aspects of systems and methods herein.

It will be readily understood that the systems and methods of the present disclosure, as generally described and illustrated in the drawings herein, may be arranged and designed in a wide variety of different configurations in addition to the systems and methods described herein. Thus, the following detailed description of the systems and methods, as represented in the drawings, is not intended to limit the scope defined by the appended claims, but is merely representative of selected systems and methods. The following description is intended only by way of example, and simply illustrates certain concepts of the systems and methods, as disclosed and claimed herein.

Disclosed herein is a circuit for addressing over faulty memory arrays of variable size, pointing virtual addresses only to good physical locations. With this circuit, a memory system containing faulty arrays can present a single, unified address space to the client machine. Addressing over memory arrays of variable size can repair a large variety of physical defects with many less repair resources than a fixed-size scheme.

Figure 2:
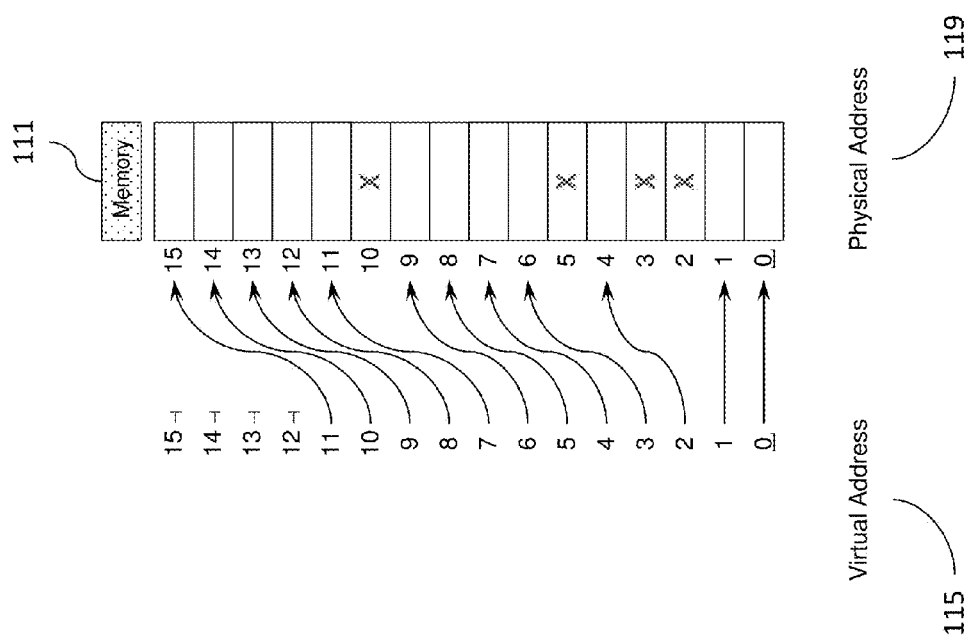
FIG. 2 is a block diagram illustrating an exemplary mapping of memory addresses according to systems and methods herein.

The concept of "addressing over" bad addresses is illustrated in FIG. 2. As shown in FIG. 2, locations 2, 3, 5, and 10 are failed in the memory 111. According to systems and methods herein, a virtual address 115 is directed to an appropriate physical address 119. For example, virtual addresses 0 and 1 point to their physical counterparts because the memory in physical addresses 0 and 1 are good. Virtual address 2, however, points to location 4; physical addresses 2 and 3 have been "addressed over". Virtual addresses 3, 4, 5, and 6 point to locations 6, 7, 8, and 9; this addresses over physical address 5. Virtual addresses 7, 8, 9, 10, and 11 point to locations 11, 12, 13, 14, 15; this addresses over physical address 10, as well. Virtual addresses 12-15 are now invalid because they have no locations at which to point. Note, according to systems and methods herein, all virtual addresses 115 are offset by some amount ([0, 1] offset by 0, [2] by 2, [3, 4, 5, 6] by 3, and [7, 8, 9, 10, 11] by 4), based on the pattern of failures in the memory under repair.

Referring to FIG. 1, a system, indicated generally as 123, is shown. The system 123 comprises three memory devices: (1) a Ternary Content Addressable Memory (TCAM) 127, (2) a random-access memory (RAM) 131, and (3) a memory 111, sometimes referred to herein as the memory under repair. Faulty address ranges in the memory 111 are addressed over by a circuit, indicated generally as 135, comprising the TCAM 127 and RAM 131, as well as a reduction circuit 139, a priority encoder 143, and an Adder 147. According to systems and methods herein, the memory 111 can be any memory technology (SRAM, DRAM, eDRAM, MRAM, PCM, Flash, etc.). Similarly, tables in the TCAM 127 and RAM 131 can be implemented in any type of memory.

An input to the circuit 135 is a virtual address 115, which is provided by a client machine. The output of the circuit 135 is a physical address 119, which is used to index the physical memory space in the memory 111. The mapping process from virtual address 115 to physical address 119 uses the five circuit blocks. The first block of the circuit 135 is the Ternary Content Addressable Memory (TCAM) 127. The TCAM 127 comprises cells storing data values comprising ranges of addresses. The ranges of addresses correspond to virtual addresses that, in combination with an offset, point away from failed memory address in the memory under repair. The TCAM 127 provides four values: 0, 1, "don't care" or "always match", indicated by *, and "never match", indicated by a blank. The TCAM 127 searches on the virtual address 115 to determine if an offset is required to map the virtual address 115 to a good memory location within the physical memory—the third state of the TCAM 127 ("always-match") is what enables variable size mapping.

According to systems and methods herein, the ranges of addresses are sorted in increasing order in the TCAM 127. Depending on the programmed contents of the TCAM 127, the repair action can repair variable-size memory blocks of any size, for example 1, 2, 3, 4, or more, memory locations.

The TCAM 127 is used to implement a "strictly-less-than" function for some number of address ranges. According to systems and methods herein, one or more entries in the TCAM 127 are used to implement the "less-than" function for a single range. Accordingly, the second block of the circuit 135 is a reduction circuit 139. The reduction circuit 139 is placed on the output of the TCAM 127. The reduction circuit 139 produces a single "less-than" signal for each range of addresses programmed into the TCAM 127. The third block of the circuit 135 is a priority encoder 143 that takes the output of the reduction circuit and selects the "less-than" signal of only the first range of addresses that contains the virtual address 115. The priority encoder 143 passes on the first range of addresses to the Random Access Memory (RAM) 131.

The RAM 131 is the fourth block of the circuit 135. The RAM 131 comprises cells storing data values comprising an offset value for each range of the ranges of addresses.

The fifth block of the circuit 135 is the Adder 147. The Adder 147 adds the offset value from the RAM 131 to the virtual address 115 in order to produce the physical address 119.

A virtual address 115 is compared against one or more entries in the TCAM 127 to find the lowest range of addresses containing the virtual address 115. The circuit 135 calculates and delivers mapping data for that virtual address 115. The system 123 may use several entries in the TCAM 127 and one entry in the RAM 131 to execute one repair. The reduction circuit 139 converts the several matchlines from the TCAM 127 into one match signal per repair. A simple priority encoder 143 detects the first match.

Figure 3A:
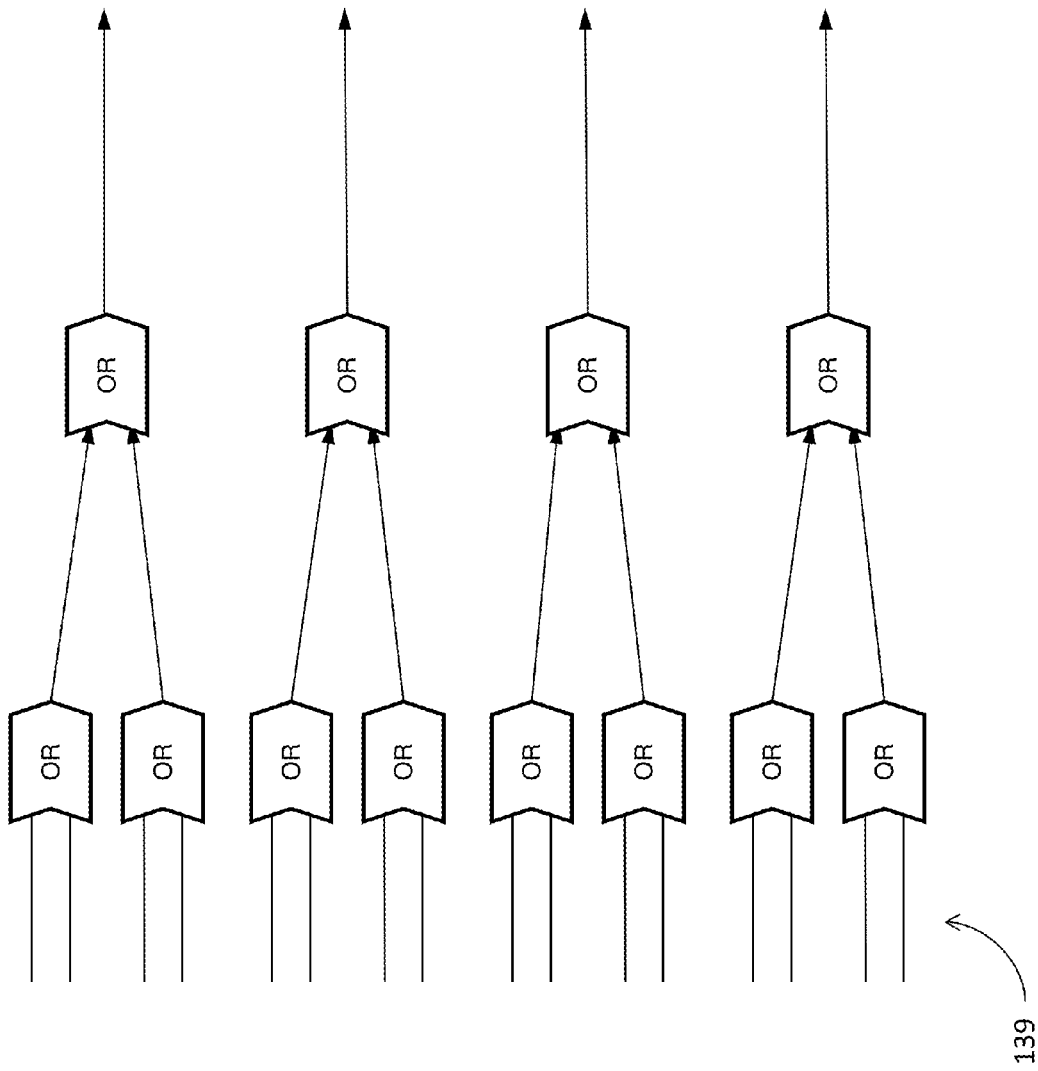
FIGS. 3A, 3B, and 3C are block diagram illustrating examples of a reduction circuit according to systems and methods herein.
Figure 3B:
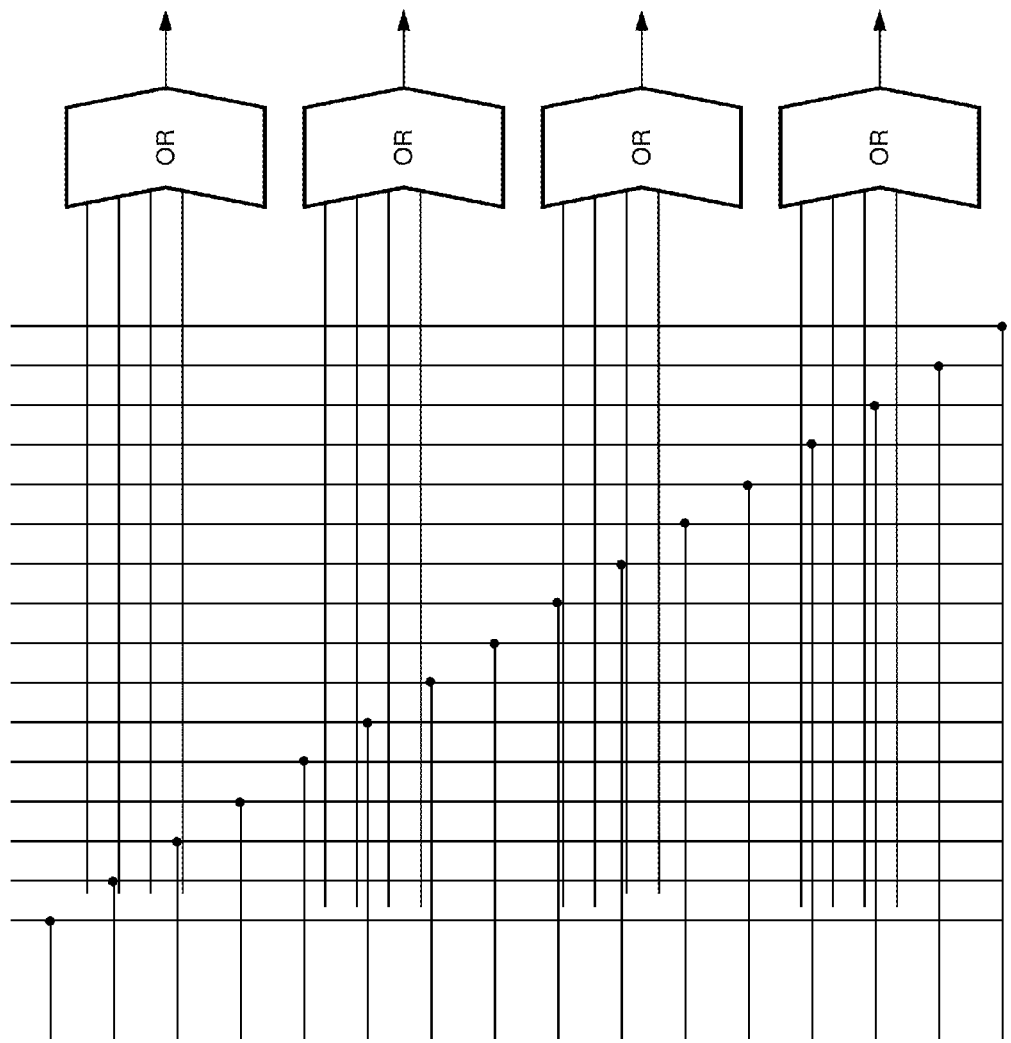
Figure 3C:
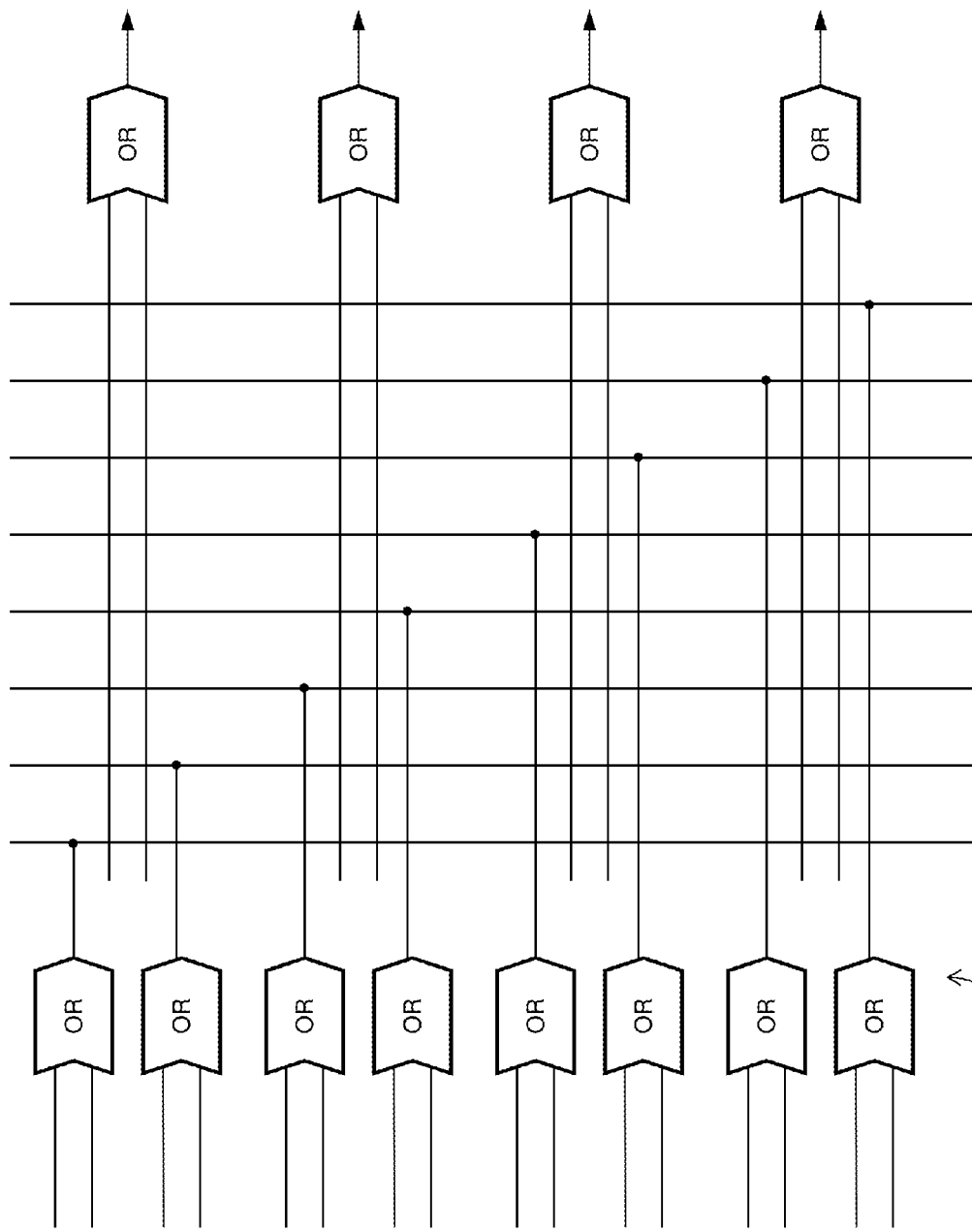

FIGS. 3A, 3B, and 3C illustrate various exemplary options for the reduction circuit 139 portion of the circuit 135. As shown herein, the reduction circuit 139 comprises an OR-reduction circuit. FIG. 3A shows a "hardwired" design having a fixed reduction pattern that assumes the worst-case number of entries in the TCAM 127 per match range. The "hardwired" design reduces the average number of repairs that can be made. FIG. 3B shows a "programmable" design, which is essentially the opposite of the "hardwired" design. In the "programmable" design of FIG. 3B, all connections between the output of the TCAM 127 and the OR gates are programmable. That is, each crosspoint in FIG. 3B may use a register and pass gate. This maximizes the average number of repairs, but has much more hardware to implement. FIG. 3C shows a "hybrid" design. The "hybrid" design of FIG. 3C combines a portion of the "hardwired" design shown in FIG. 3A and a portion of the "programmable" design shown FIG. 3B. As shown in FIG. 3C, part of the reduction process is hardwired and the remainder is programmed. This design has middling repair capability and hardware cost. It is contemplated that other designs for a reduction circuit, as would be known by one ordinarily skilled in the art, may be used.

Figure 4:
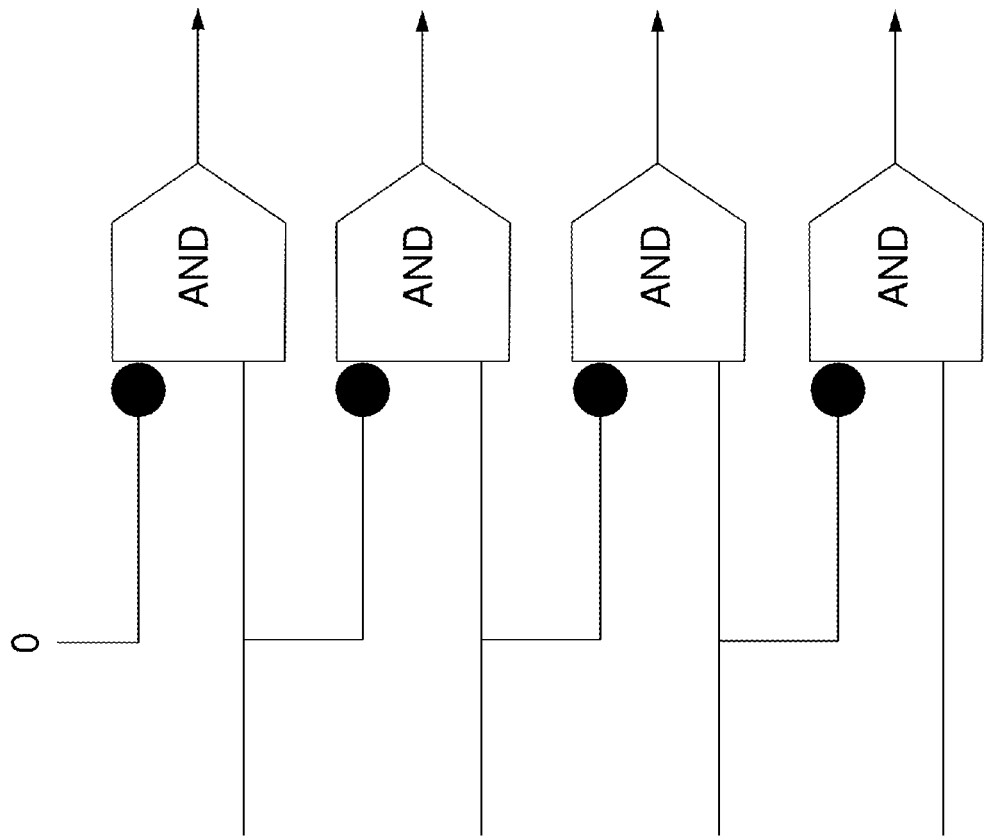
FIG. 4 is a block diagram illustrating an example of a priority encoder according to systems and methods herein.

FIG. 4 shows an example of the priority encoder 143. The output of the reduction circuit 139 is either 'high' to signal 'less-than' or 'low' to signal 'greater-than-or-equal'. According to the present disclosure, the system 123 detects the first matching range. The priority encoder 143 accomplishes this by testing for each range, if the next smaller range is greater-than-or-equal. The single range for which this is true may be passed to the RAM 131 and is used to determine the output of the RAM 131. Note: the circuit shown in FIG. 4 is not a traditional priority encoder; this significantly simplified circuit implementation of the priority encoding function is enabled by the strict ordering of the less-than functions in the TCAM. It is contemplated that an appropriate design for a traditional priority encoder circuit, as would be known by one ordinarily skilled in the art, may also be used.

Below is an example of the entries in the TCAM 127 that may be used to produce a less-than function for a given number. In this example, the desired function is less-than-27. Note: 27=16+8+2+1. The upper limit is broken into binary portions, each of which becomes an entry in the TCAM 127.

| Addresses | TCAM Pattern |
|---|---|
| 0:15 (00000:011111) | 0**** |
| 16:23 (10000:10111) | 10*** |
| 24:25 (11000:11001) | 1100* |
| 26 (11010) | 11010 |

In the best case, one entry in the TCAM 127 is required for a given function; in the worst case, n entries are required (where n is the width of addresses).

Figures 5, 6:
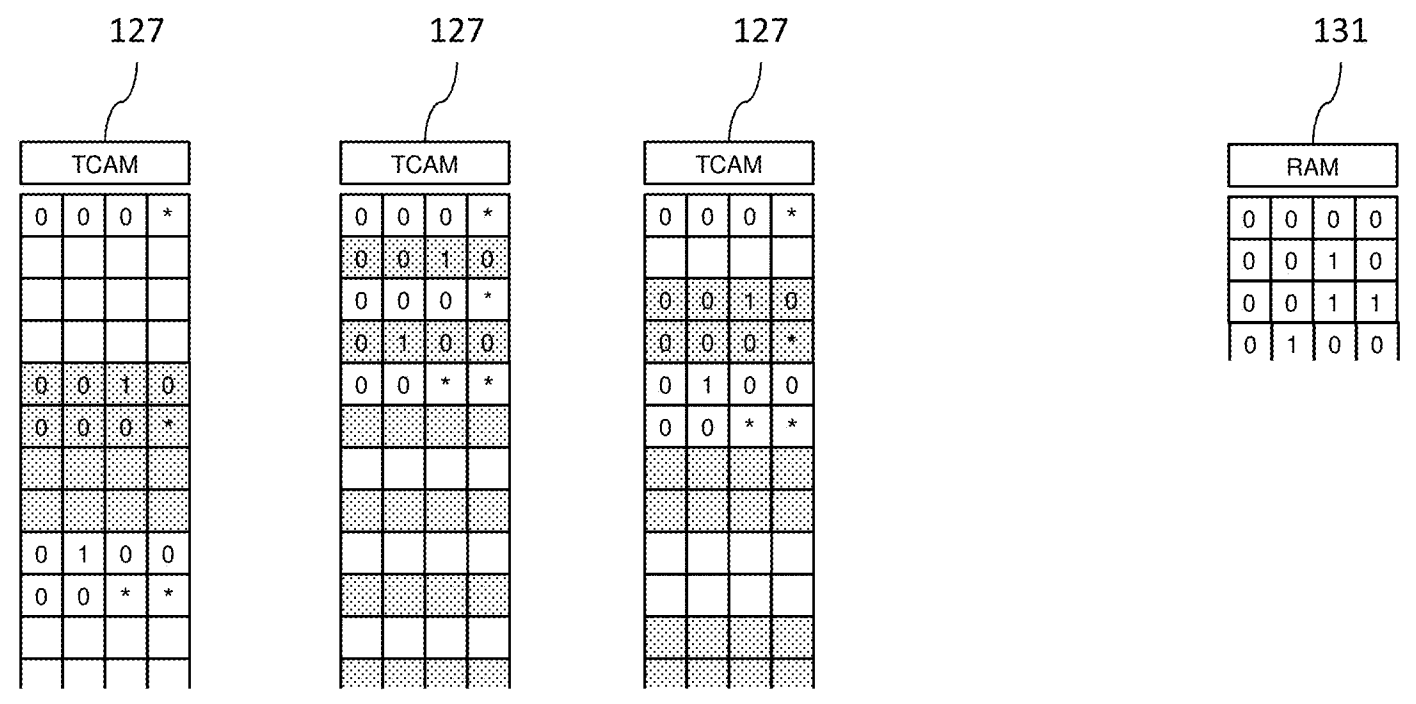

FIG. 5 shows several examples of the contents of the TCAM 127. The TCAM contents are listed three times, corresponding to hardwired, programmable, and hybrid reduction circuits illustrated in FIGS. 3A, 3B, and 3C. In FIG. 5, an '*' indicates ALWAYS-MATCH, '0'/'1' indicates matching that value, and blank indicates NEVERMATCH. The white/gray shading indicates groups of TCAM entries that are forced by hardwired design in the OR-reduction. FIG. 6 shows an example of the contents of the RAM 131. These contents were generated from the example mapping shown in FIG. 2. The contents of the RAM 131 are 0, 2, 3, and 4, which are the requisite offsets for the address ranges [0-1], [2], [3-6], and [7-11].

Every virtual address 115 produced by the client passes through the circuit 135 on its way to the memory 111. The TCAM 127 performs a simultaneous bitwise comparison of the incoming virtual address 115 with all entries in the TCAM 127. The virtual address 115 is included in at least one of the ranges of addresses in the TCAM 127. The reduction circuit 139 produces an output for each range of addresses in which the virtual address 115 may be included. The priority encoder 143 then selects the first programmed range, which it passes to the RAM 131. The corresponding entry in the RAM 131 is the offset value to "address over" the failed memory address. The offset value is output as the first input of the Adder 147. The second input of the Adder 147 is the incoming virtual address 115. The output 151 of the Adder 147 is the final, safe address that is then used to access the memory 111. In this way, a virtual address space is fit automatically to a larger physical memory by mapping ranges of the virtual address space to functional ranges in the physical memory.

Figure 7:
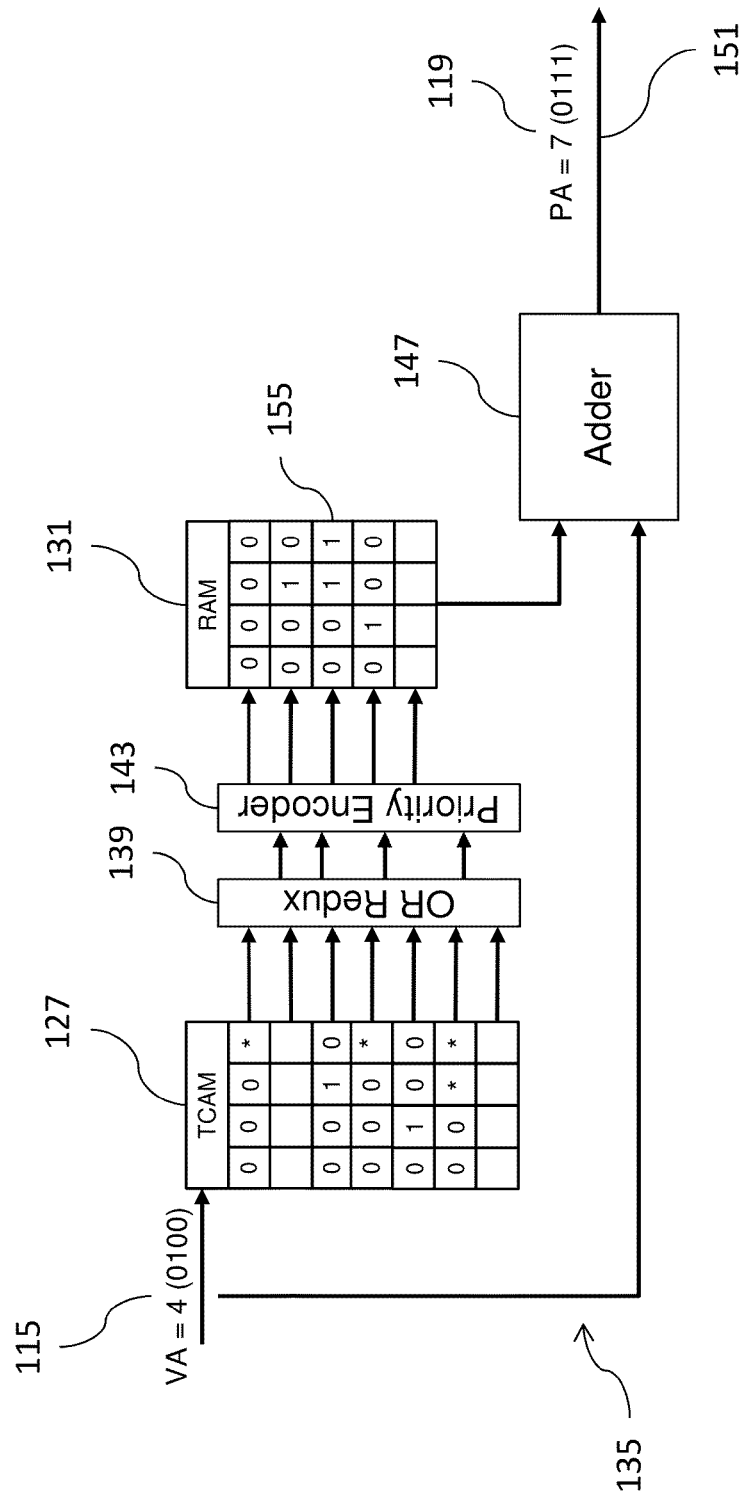
FIG. 7 is a block diagram illustrating a specific example of the operation of systems and methods herein.

FIG. 7 shows the operation of the circuit 135 given the specific mapping illustrated in FIG. 2. An input virtual address of 4 (0100) is provided to the TCAM 127. An entry of the TCAM 127 shows a match (0100), indicating that the virtual address 115 is in at least one of the ranges of addresses stored in the TCAM 127. The reduction circuit 139 identifies ranges (less-than 2, less-than 3, less-than 7, and less-than 12). The priority encoder 143 selects the first range that is true (less-than 7) and passes the range to the RAM 131, which produces an offset 155. In this example, the bit pattern for the offset 155 is 0011 (+3). The offset 155 is added to the input, 0100, to produce 0111. This gives a new physical address, 7, as specified in the mapping.

Figures 8A, 8B, 8C:
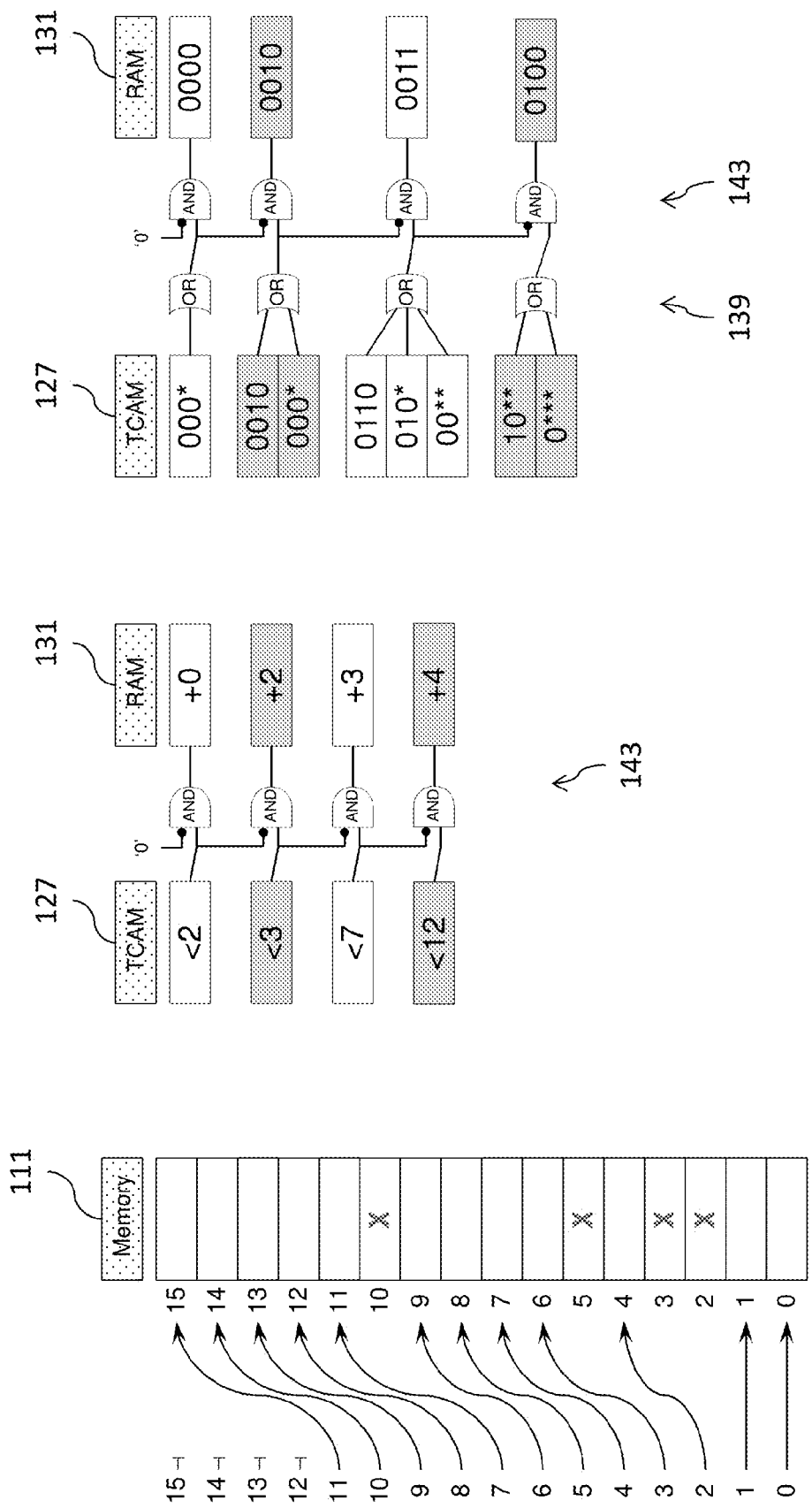
FIGS. 8A, 8B, and 8C are block diagram illustrating a specific example of the operation of TCAM and RAM entries according to systems and methods herein.

FIGS. 8A-8C illustrate a detailed example of the contents and operation of the TCAM 127 and RAM 131 according to systems and methods herein. FIG. 8A is the same as FIG. 2 showing the mapping required for the failed memory locations at 2, 3, 5, and 10 according to the present example. FIG. 8B shows the logical contents of the TCAM 127 and RAM 131, and FIG. 8C shows the physical contents of the TCAM 127 and RAM 131. As used herein, the logical contents indicate the purpose of the programmed contents and the physical contents indicate the actual bits stored and implemented by the circuit. According to the specific example, the logical memory contents are determined as follows: addresses 0 and 1 will be offset by 0, address 2 will be offset by 2, addresses 3-6 will be offset by 3, and addresses 7-11 will be offset by 4, because of the failed memory locations at 2, 3, 5 and 10. The circuit accomplishes this by checking for addresses <2 and assigning them an offset of +0. Similarly, the circuit checks for addresses <3 and assigns them an offset of +2. The circuit checks for addresses <7 and assigns them an offset of +3. Finally, the circuit checks for addresses <12 and assigns them an offset of +4.

Continuing the example shown in FIG. 7, logically, address 4 is <7 and <12; therefore, address 4 matches at least two ranges. The priority encoder determines the first address range containing the virtual address. For virtual address=4, the first AND gate checks "<2 and not '0'", which is false; the second checks "<3 and not <2", which is also false; the third checks "<7 and not <3", which is true; the fourth checks "<12 and not <7", which is false. Thus, only the range <7 is needed and +3 is selected as the offset.

The physical memory contents illustrated in FIG. 8C show how the ranges and offsets may actually be stored in hardware. The 'less-than' operations are composed of one or more TCAM entries. Less than 2 is implemented 000* (address is 0 or 1); less than 3 is implemented as 0010 and 000* (address is 2 or address is 0 or 1); less than 7 is implemented as 0110 and 010* and 00 (address is 6 or address is 4 or 5 or address is 0 or 1 or 2 or 3); and less than 12 is implemented as 10 and 0* (address is 8 or 9 or 10 or 11 or address is 0 or 1 or 2 or 3 or 4 or 5 or 6 or 7). The match signals generated by the one or more TCAM entries for each range are then reduced to a single range signal corresponding to the input address via the reduction circuit 139. This figure uses the exemplary "programmable" reduction circuit 139** illustrated in detail in FIG. 3B.

The examples herein show a 16-entry memory space. It is contemplated that this could be 16 subarrays within a macro, 16 macros in a chip, 16 chips in a 3-D memory, or any other level in the hierarchy. Additionally, the number of entries could be 4, 16, 64 k, or any other number. The scale of the memory space and the number of entries in the address space are simply the parameters of a given specific implementation of the circuit and immaterial to the general design.

According to systems and methods herein, the contents of the TCAM 127 and RAM 131 can be generated off-host and programmed in at power-up. The particular methods of generation and programming are independent of the mapping operation disclosed herein.

Figure 9:
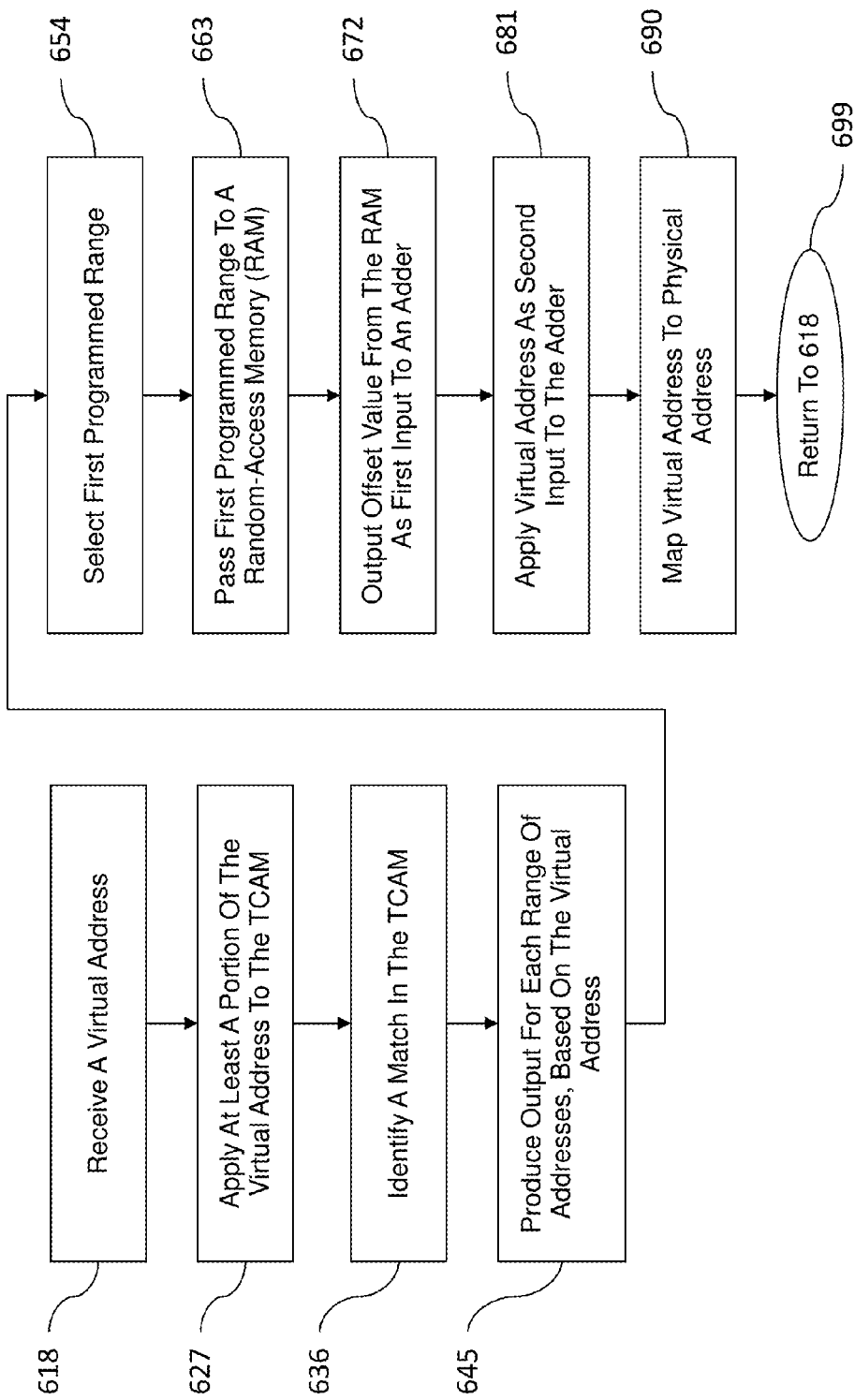
FIG. 9 is a flow diagram illustrating systems and methods herein.

FIG. 9 is a flow diagram illustrating the processing flow of an exemplary method according to systems and methods herein. A Ternary Content Addressable Memory (TCAM) is configured with data values comprising ranges of addresses in a memory under repair having variable size blocks of failed memory addresses. The ranges of addresses correspond to virtual addresses that, in combination with an offset, point away from failed memory address in the memory under repair. At 618, a virtual address is received. At least a portion of the virtual address is applied to the TCAM, at 627. At 636, a match is identified in the TCAM indicating the virtual address is in at least one range of the ranges of addresses. At 645, a single output is produced for each programmed range of the ranges of addresses, based on the virtual address. One or more entries in the TCAM correspond to an entry in the RAM for an offset value that corresponds to the range of addresses containing the virtual address. At 654, a first programmed range is selected. At 663, the first programmed range is passed to a random-access memory (RAM). The RAM is configured with data values comprising offset values for each range of the ranges of addresses. At 672, an offset value is output from the RAM as a first input to an Adder. The offset value corresponds to the first programmed range. The virtual address is applied as a second input to the Adder, at 681. At 690, the virtual address is mapped to a physical address for a functional memory address in the memory under repair. Operation continues for the next virtual address received, as indicated at 699.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

For electronic applications, semiconducting substrates, such as silicon wafers, can be used. The substrate enables easy handling of the micro device through the many fabrication steps. Often, many individual devices are made together on one substrate and then singulated into separated devices toward the end of fabrication. In order to fabricate a microdevice, many processes are performed, one after the other, many times repeatedly. These processes typically include depositing a film, patterning the film with the desired micro features, and removing (or etching) portions of the film. For example, in memory chip fabrication, there may be several lithography steps, oxidation steps, etching steps, doping steps, and many others are performed. The complexity of microfabrication processes can be described by their mask count.

An integrated circuit structure according to systems and methods herein may include a memory under repair having variable size blocks of failed memory addresses. The memory under repair is operatively connected to a first memory organized as a Ternary Content Addressable Memory (TCAM). The TCAM comprises cells storing data values comprising ranges of addresses. The TCAM is operatively connected to a virtual address line. A reduction circuit is operatively connected to the TCAM. A priority encoder is operatively connected to the reduction circuit. A second memory organized as a random-access memory (RAM) is operatively connected to the priority encoder. The RAM comprises cells storing data values comprising an offset value for each range of the ranges of addresses. The integrated circuit structure includes a processor. The processor identifies ranges of addresses in the memory under repair. The ranges of addresses correspond to virtual addresses that, in combination with an offset, point away from failed memory address in the memory under repair. The processor identifies unused functional memory locations in the memory under repair. The processor receives a virtual address and produces a single output for each programmed range of the ranges of addresses, using the reduction circuit. The processor selects a first programmed range from the reduction circuit, using the priority encoder, based on the virtual address. The processor calculates a physical memory address in an unused functional memory location in the memory under repair for the virtual address based on the virtual address and the offset. And, the processor directs the virtual address to the physical memory address in the unused functional memory location.

Aspects of the present disclosure are described herein with reference to flowchart illustrations and/or block diagrams of methods, apparatus (systems), and computer program products according to various systems and methods. It will be understood that each block of the flowchart illustrations and/or two-dimensional block diagrams, and combinations of blocks in the flowchart illustrations and/or block diagrams, can be implemented by computer program instructions. The computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

According to a further system and method herein, an article of manufacture is provided that includes a tangible computer readable medium having computer readable instructions embodied therein for performing the steps of the computer implemented methods, including, but not limited to, the method illustrated in FIG. 9. Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. Any of these devices may have computer readable instructions for carrying out the steps of the methods described above with reference to FIG. 9.

The computer program instructions may be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

Furthermore, the computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

In case of implementing the systems and methods herein by software and/or firmware, a program constituting the software may be installed into a computer with dedicated hardware, from a storage medium or a network, and the computer is capable of performing various functions if with various programs installed therein.

Figure 10:
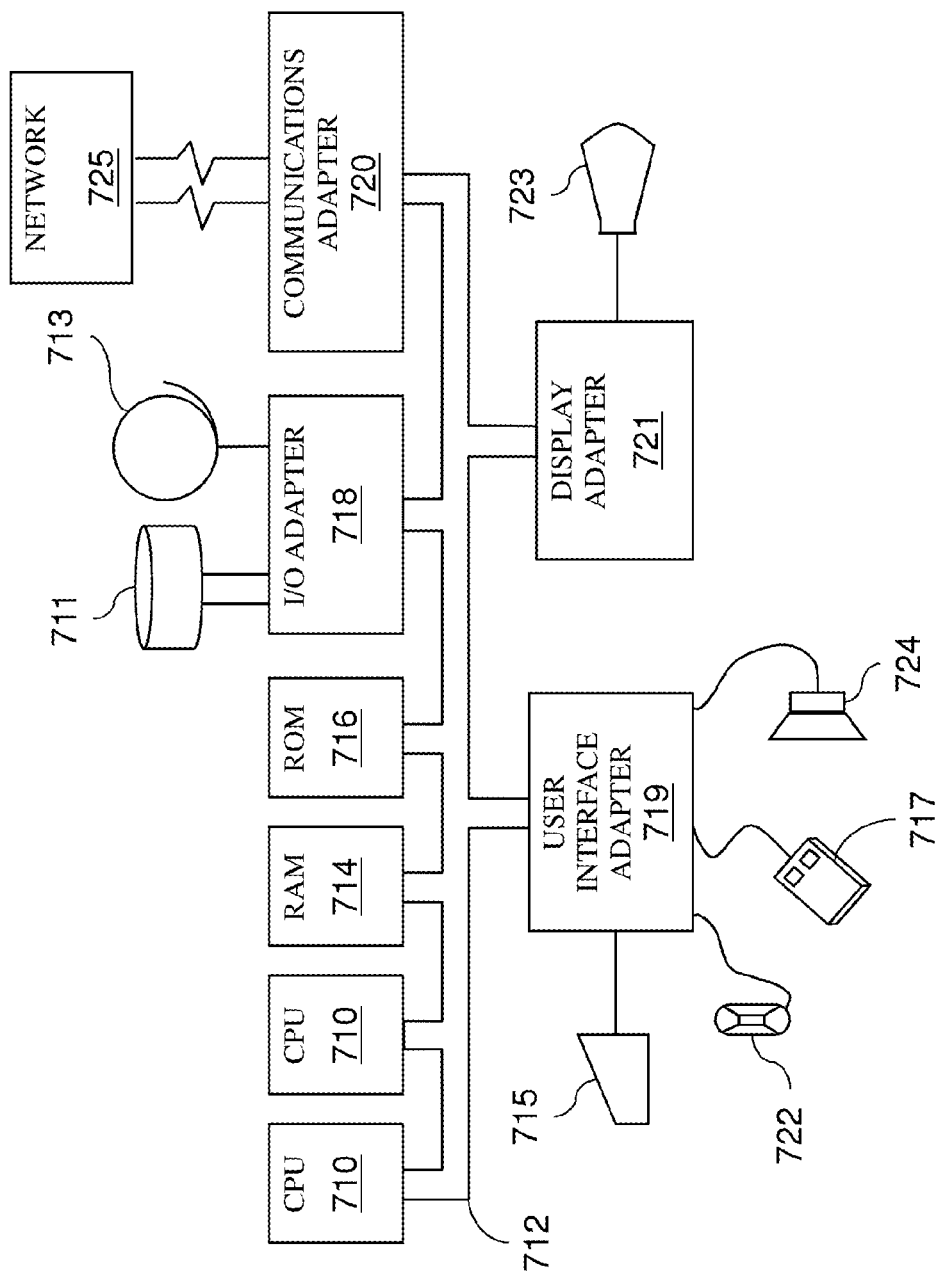
FIG. 10 is a schematic diagram of a hardware system according to systems and methods herein.

A representative hardware environment for practicing the systems and methods herein is depicted in FIG. 10. This schematic drawing illustrates a hardware configuration of an information handling/computer system in accordance with the systems and methods herein. The system comprises at least one processor or central processing unit (CPU) 710. The CPUs 710 are interconnected via system bus 712 to various devices such as a Random Access Memory (RAM) 714, Read-Only Memory (ROM) 716, and an Input/Output (I/O) adapter 718. The I/O adapter 718 can connect to peripheral devices, such as disk units 711 and tape drives 713, or other program storage devices that are readable by the system. The system can read the inventive instructions on the program storage devices and follow these instructions to execute the methodology of the systems and methods herein.

In FIG. 10, CPUs 710 perform various processing based on a program stored in a Read Only Memory (ROM) 716 or a program loaded from a peripheral device, such as disk units 711 and tape drives 713 to a Random Access Memory (RAM) 714. In the RAM 714, required data when the CPUs 710 perform the various processing or the like is also stored, as necessary. The CPUs 710, the ROM 716, and the RAM 714 are connected to one another via a bus 712. An I/O adapter 718 is also connected to the bus 712 to provide an input/output interface, as necessary. A removable medium, such as a magnetic disk, an optical disk, a magneto-optical disk, a semiconductor memory, or the like, is installed on the peripheral device, as necessary, so that a computer program read therefrom may be installed into the RAM 714, as necessary.

The system further includes a user interface adapter 719 that connects a keyboard 715, mouse 717, speaker 724, microphone 722, and/or other user interface devices such as a touch screen device (not shown) to the bus 712 to gather user input. Additionally, a communication adapter 720 including a network interface card such as a LAN card, a modem, or the like connects the bus 712 to a data processing network 725. The communication adapter 720 performs communication processing via a network such as the Internet. A display adapter 721 connects the bus 712 to a display device 723, which may be embodied as an output device such as a monitor (such as a Cathode Ray Tube (CRT), a Liquid Crystal Display (LCD), or the like), printer, or transmitter, for example.

In the case where the above-described series of processing is implemented with software, the program that constitutes the software may be installed from a network such as the Internet or a storage medium such as the removable medium.

Those skilled in the art would appreciate that the storage medium is not limited to the peripheral device having the program stored therein as illustrated in FIG. 8, which is distributed separately from the device for providing the program to the user. Examples of a removable medium include a magnetic disk (including a floppy disk), an optical disk (including a Compact Disk-Read Only Memory (CD-ROM) and a Digital Versatile Disk (DVD)), a magneto-optical disk (including a Mini-Disk (MD) (registered trademark)), and a semiconductor memory. Alternatively, the storage medium may be the ROM 716, a hard disk contained in the storage section of the disk units 711, or the like, which has the program stored therein and is distributed to the user together with the device that contains them.

As will be appreciated by one skilled in the art, aspects of the systems and methods herein may be embodied as a system, method, or computer program product. Accordingly, aspects of the present disclosure may take the form of an entirely hardware system, an entirely software system (including firmware, resident software, micro-code, etc.) or an system combining software and hardware aspects that may all generally be referred to herein as a "circuit," "module", or "system." Furthermore, aspects of the present disclosure may take the form of a computer program product embodied in one or more computer readable medium(s) having computer readable program code embodied thereon.

Any combination of one or more computer readable non-transitory medium(s) may be utilized. The computer readable medium may be a computer readable signal medium or a computer readable storage medium. The non-transitory computer storage medium stores instructions, and a processor executes the instructions to perform the methods described herein. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a Read-Only Memory (ROM), an Erasable Programmable Read-Only Memory (EPROM or Flash memory), an optical fiber, a magnetic storage device, a portable compact disc Read-Only Memory (CD-ROM), an optical storage device, a "plug-and-play" memory device, like a USB flash drive, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including, but not limited to, wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++, or the like and conventional procedural programming languages, such as the "C" programming language or similar programming languages. The program code may execute entirely on the user's computer, partly on the user's computer, as a stand-alone software package, partly on the user's computer and partly on a remote computer, or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The flowchart and block diagrams in the Figures illustrate the architecture, functionality, and operation of possible implementations of systems, methods, and computer program products according to various systems and methods herein. In this regard, each block in the flowchart or block diagrams may represent a module, segment, or portion of code, which comprises one or more executable instructions for implementing the specified logical function(s). It should also be noted that, in some alternative implementations, the functions noted in the block might occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

Deployment types include loading directly in the client, server, and proxy computers via loading a storage medium such as a CD, DVD, etc. The process software may also be automatically or semi-automatically deployed into a computer system by sending the process software to a central server or a group of central servers. The process software is then downloaded into the client computers that will execute the process software. The process software is sent directly to the client system via e-mail. The process software is then either detached to a directory or loaded into a directory by a button on the e-mail that executes a program that detaches the process software into a directory. Alternatively, the process software is sent directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

While it is understood that the process software may be deployed by manually loading directly in the client, server, and proxy computers via loading a storage medium such as a CD, DVD, etc., the process software may also be automatically or semi-automatically deployed into a computer system by sending the process software to a central server or a group of central servers. The process software is then downloaded into the client computers that will execute the process software. Alternatively, the process software is sent directly to the client system via e-mail. The process software is then either detached to a directory or loaded into a directory by a button on the e-mail that executes a program that detaches the process software into a directory. Another alternative is to send the process software directly to a directory on the client computer hard drive. When there are proxy servers, the process will select the proxy server code, determine on which computers to place the proxy servers' code, transmit the proxy server code, and then install the proxy server code on the proxy computer. The process software will be transmitted to the proxy server, and then stored on the proxy server.

Figure 11:
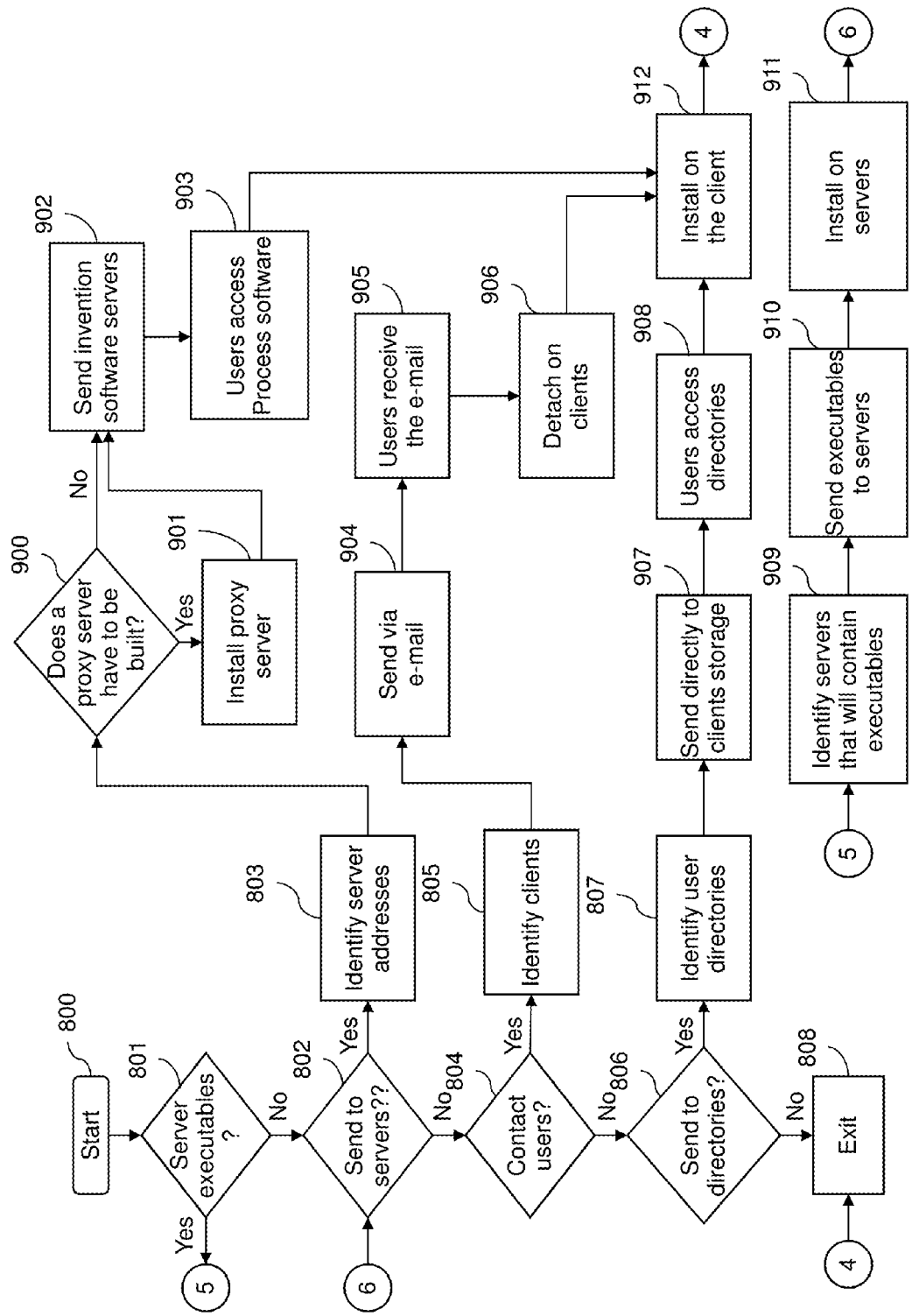
FIG. 11 is a schematic diagram of a deployment system according to systems and methods herein.

In FIG. 11, step 800 begins the deployment of the process software. The first thing is to determine if there are any programs that will reside on a server or servers when the process software is executed 801. If this is the case, then the servers that will contain the executables are identified 909. The process software for the server or servers is transferred directly to the servers' storage via FTP or some other protocol, or by copying through the use of a shared file system 910. The process software is then installed on the servers 911.

Next, a determination is made on whether the process software is to be deployed by having users access the process software on a server or servers 802. If the users are to access the process software on servers, then the server addresses that will store the process software are identified 803.

A determination is made if a proxy server is to be built 900 to store the process software. A proxy server is a server that sits between a client application, such as a Web browser, and a real server. It intercepts all requests to the real server to see if it can fulfill the requests itself. If not, it forwards the request to the real server. The two primary benefits of a proxy server are to improve performance and to filter requests. If a proxy server is required, then the proxy server is installed 901. The process software is either sent to the servers via a protocol such as FTP or it is copied directly from the source files to the server files via file sharing 902. Another method would be to send a transaction to the servers that contain the process software and have the server process the transaction, then receive and copy the process software to the server's file system. Once the process software is stored at the servers, the users, via their client computers, then access the process software on the servers and copy it to their client computers' file systems 903. Another method is to have the servers automatically copy the process software to each client and then run the installation program for the process software at each client computer. The users execute the program that installs the process software on their client computer 912, and then exit the process 808.

In step 804, a determination is made whether the process software is to be deployed by sending the process software to users via e-mail. The set of users where the process software will be deployed are identified together with the addresses of the user client computers 805. The process software is sent via e-mail 904 to each of the users' client computers. The users receive the e-mail 905 and then detach the process software from the e-mail to a directory on their client computers 906. The users execute the program that installs the process software on their client computer 912, and then exit the process 808.

Lastly, a determination is made on whether the process software will be sent directly to user directories on their client computers 806. If so, the user directories are identified 807. The process software is transferred directly to the users' client computer directory 907. This can be done in several ways such as, but not limited to, sharing of the file system directories and then copying from the sender's file system to the recipient users' file system or alternatively using a transfer protocol such as File Transfer Protocol (FTP). The users access the directories on their client file systems in preparation for installing the process software 908. The users execute the program that installs the process software on their client computer 912, and then exit the process 808.

The process software is integrated into a client, server, and network environment by providing for the process software to coexist with applications, operating systems, and network operating systems software, and then installing the process software on the clients and servers in the environment where the process software will function.

The first step is to identify any software on the clients and servers including the network operating system where the process software will be deployed that are required by the process software or that work in conjunction with the process software. This includes the network operating system that is software that enhances a basic operating system by adding networking features.

Next, the software applications and version numbers will be identified and compared to the list of software applications and version numbers that have been tested to work with the process software. Those software applications that are missing or that do not match the correct version will be upgraded with the correct version numbers. Program instructions that pass parameters from the process software to the software applications will be checked to ensure the parameter lists match the parameter lists required by the process software. Conversely, parameters passed by the software applications to the process software will be checked to ensure the parameters match the parameters required by the process software. The client and server operating systems including the network operating systems will be identified and compared to the list of operating systems, version numbers, and network software that have been tested to work with the process software. Those operating systems, version numbers, and network software that do not match the list of tested operating systems and version numbers will be upgraded on the clients and servers to the required level.

After ensuring that the software, where the process software is to be deployed, is at the correct version level that has been tested to work with the process software, the integration is completed by installing the process software on the clients and servers.

Figure 12:
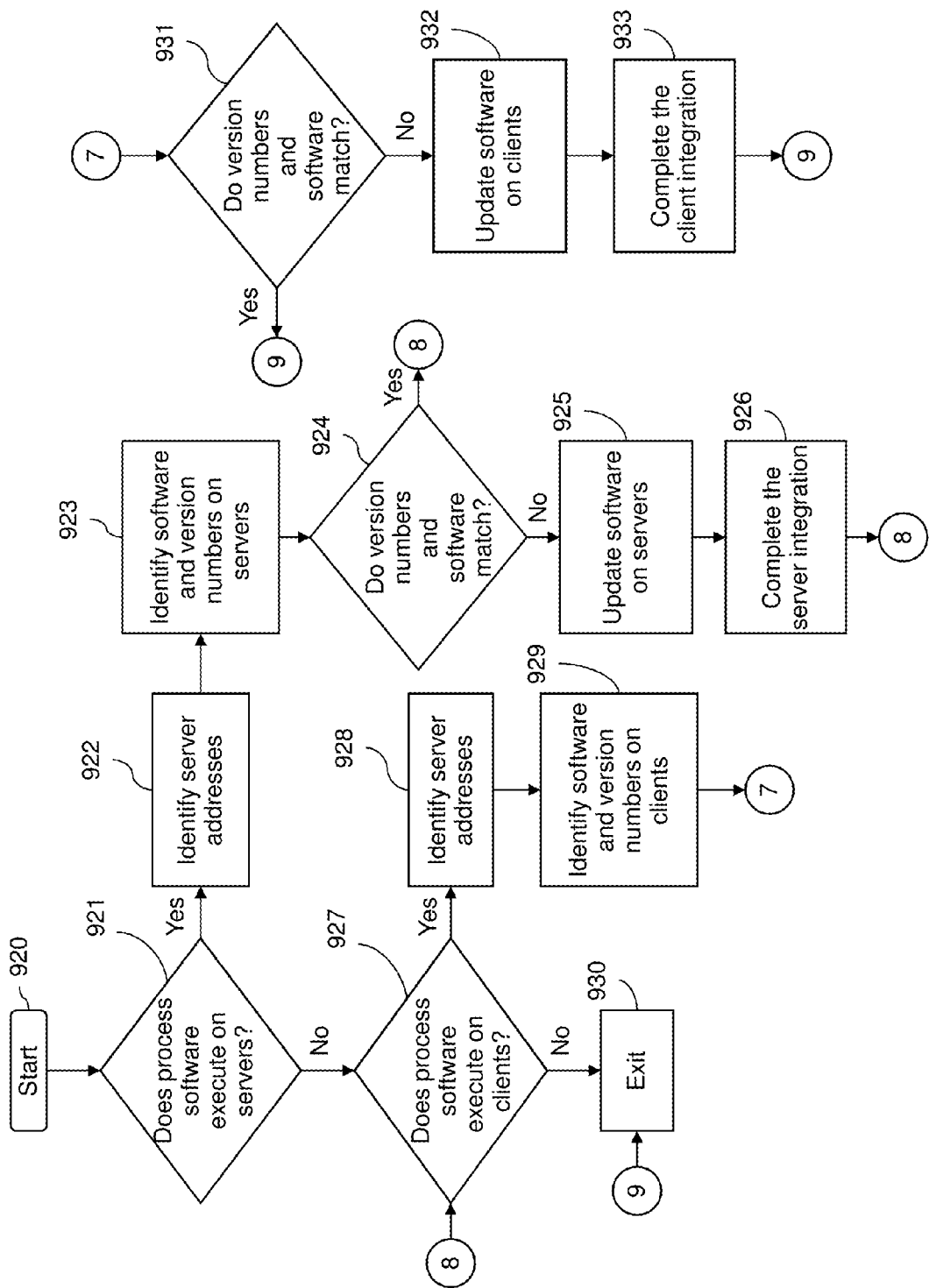
FIG. 12 is a schematic diagram of an integration system according to systems and methods herein.

In FIG. 12, step 920 begins the integration of the process software. The first thing is to determine if there are any process software programs that will execute on a server or servers 921. If this is not the case, then integration proceeds to 927. If this is the case, then the server addresses are identified 922. The servers are checked to see if they contain software that includes the operating system (OS), applications, and network operating systems (NOS), together with their version numbers that have been tested with the process software 923. The servers are also checked to determine if there is any missing software that is required by the process software 923.

A determination is made if the version numbers match the version numbers of OS, applications, and NOS that have been tested with the process software 924. If all of the versions match and there is no missing required software, the integration continues in 927.

If one or more of the version numbers do not match, then the unmatched versions are updated on the server or servers with the correct versions 925. Additionally, if there is missing required software, then it is updated on the server or servers 925. The server integration is completed by installing the process software 926.

Step 927, which follows either step 921, 924, or 926, determines if there are any programs of the process software that will execute on the clients. If no process software programs execute on the clients, the integration proceeds to 930 and exits. If this is not the case, then the client addresses are identified at 928.

The clients are checked to see if they contain software that includes the operating system (OS), applications, and network operating systems (NOS), together with their version numbers that have been tested with the process software 929. The clients are also checked to determine if there is any missing software that is required by the process software 929.

A determination is made as to whether the version numbers match the version numbers of OS, applications, and NOS that have been tested with the process software 931. If all of the versions match and there is no missing required software, then the integration proceeds to 930 and exits.

If one or more of the version numbers do not match, then the unmatched versions are updated on the clients with the correct versions 932. In addition, if there is missing required software then it is updated on the clients 932. Installing the process software on the clients 933 completes the client integration. The integration proceeds to 930 and exits.

The process software is shared, simultaneously serving multiple customers in a flexible, automated fashion. It is standardized, requiring little customization, and it is scalable, providing capacity On-Demand in a pay-as-you-go model.

The process software can be stored on a shared file system accessible from one or more servers. The process software is executed via transactions that contain data and server processing requests that use CPU units on the accessed server. CPU units are units of time such as minutes, seconds, and hours on the central processor of the server. Additionally, the assessed server may make requests of other servers that require CPU units. CPU units are an example that represents one measurement of use. Other measurements of use include, but are not limited to, network bandwidth, memory usage, storage usage, packet transfers, complete transactions, etc.

When multiple customers use the same process software application, their transactions are differentiated by the parameters included in the transactions that identify the unique customer and the type of service for that customer. All of the CPU units and other measurements of use that are used for the services for each customer are recorded. When the number of transactions to any one server reaches a number that begins to affect the performance of that server, other servers are accessed to increase the capacity and to share the workload. Likewise, when other measurements of use such as network bandwidth, memory usage, storage usage, etc. approach a capacity so as to affect performance, additional network bandwidth, memory usage, storage, etc. are added to share the workload.

The measurements of use that are used for each service and customer are sent to a collecting server that sums the measurements of use for each customer for each service that was processed anywhere in the network of servers that provide the shared execution of the process software. The summed measurements of use units are periodically multiplied by unit costs and the resulting total process software application service costs are alternatively sent to the customer and/or indicated on a web site accessed by the customer, which then remits payment to the service provider.

In another method, the service provider requests payment directly from a customer account at a banking or financial institution.

In another method, if the service provider is also a customer of the customer that uses the process software application, the payment owed to the service provider is reconciled to the payment owed by the service provider to minimize the transfer of payments.

Figure 13:
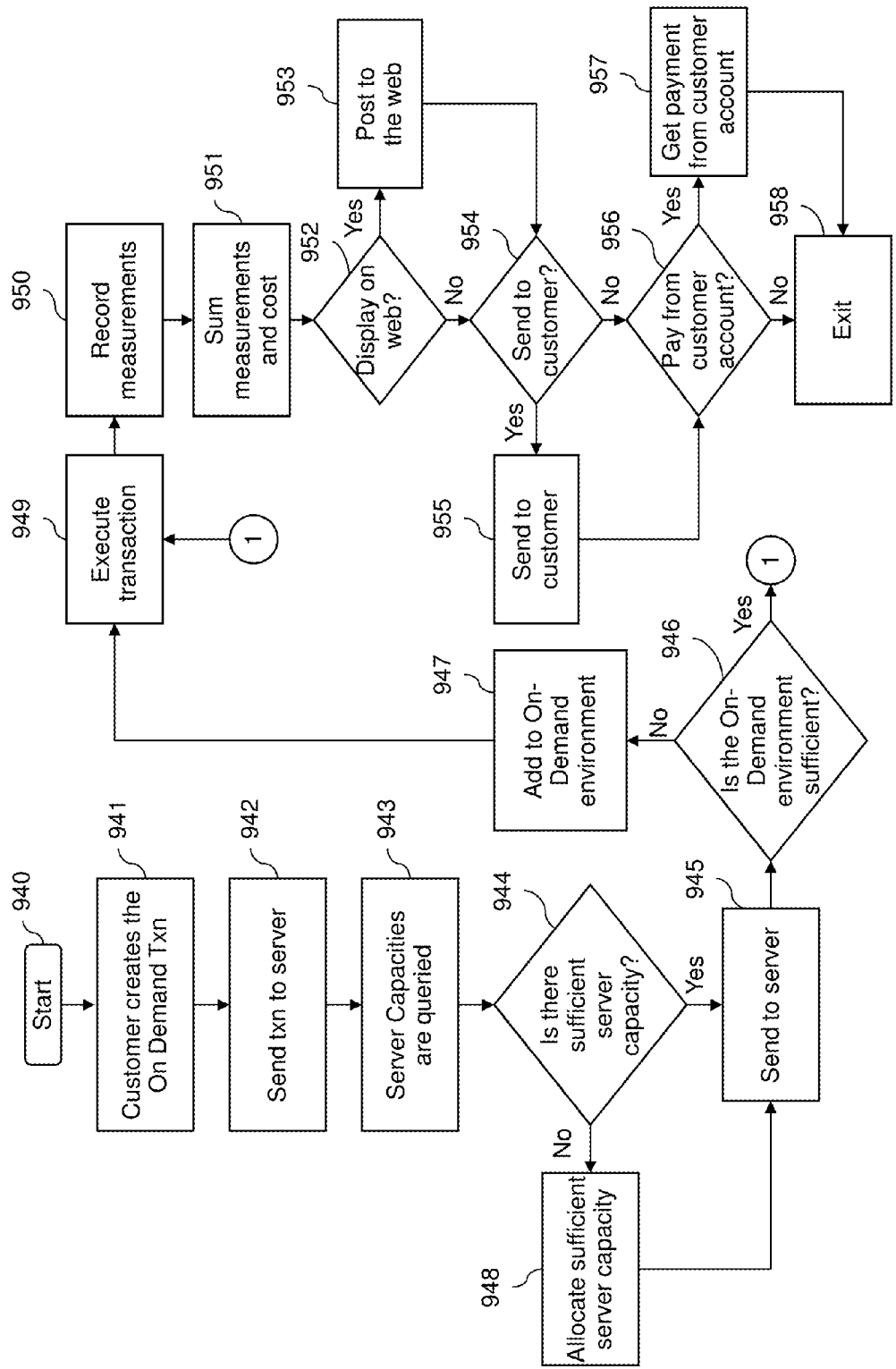
FIG. 13 is a schematic diagram of an On-Demand system according to systems and methods herein.

In FIG. 13, step 940 begins the On-Demand process. A transaction is created that contains the unique customer identification, the requested service type, and any service parameters that further specify the type of service 941. The transaction is then sent to the main server 942. In an On-Demand environment, the main server can initially be the only server, then, as capacity is consumed, other servers are added to the On-Demand environment.

The server central processing unit (CPU) capacities in the On-Demand environment are queried 943. The CPU requirement of the transaction is estimated, and then the servers' available CPU capacity in the On-Demand environment is compared to the transaction CPU requirement to see if there is sufficient CPU capacity available in any server to process the transaction 944. If there is not sufficient server CPU capacity available, then additional server CPU capacity is allocated to process the transaction 948. If there was already sufficient CPU capacity available, then the transaction is sent to a selected server 945.

Before executing the transaction, a check is made of the remaining On-Demand environment to determine if the environment has sufficient available capacity for processing the transaction. This environment capacity consists of such things as, but not limited to, network bandwidth, processor memory, storage etc. 946. If there is not sufficient available capacity, then capacity will be added to the On-Demand environment 947. Next, the required software to process the transaction is accessed, loaded into memory, and then the transaction is executed 949.

The usage measurements are recorded 950. The usage measurements consist of the portions of those functions in the On-Demand environment that are used to process the transaction. The usage of such functions as, but not limited to, network bandwidth, processor memory, storage, and CPU cycles are what are recorded. The usage measurements are summed, multiplied by unit costs, and then recorded as a charge to the requesting customer 951. If the customer has requested that the On-Demand costs be posted to a web site 952, then they are posted 953.

If the customer has requested that the On-Demand costs be sent via e-mail to a customer address 954, then they are sent 955. If the customer has requested that the On-Demand costs be paid directly from a customer account 956, then payment is received directly from the customer account 957. The last step is to exit the On-Demand process 958.

The process software may be deployed, accessed and executed through the use of a virtual private network (VPN), which is any combination of technologies that can be used to secure a connection through an otherwise unsecured or untrusted network. The use of VPNs is to improve security and for reduced operational costs. The VPN makes use of a public network, usually the Internet, to connect remote sites or users together. Instead of using a dedicated, real-world connection such as leased line, the VPN uses "virtual" connections routed through the Internet from the company's private network to the remote site or employee.

The process software may be deployed, accessed, and executed through either a remote-access or a site-to-site VPN. When using the remote-access VPNs, the process software is deployed, accessed, and executed via the secure, encrypted connections between a company's private network and remote users through a third-party service provider. The enterprise service provider (ESP) sets a network access server (NAS) and provides the remote users with desktop client software for their computers. The telecommuters can then dial a toll-free number or attach directly via a cable or DSL modem to reach the NAS and use their VPN client software to access the corporate network and to access, download, and execute the process software.

When using the site-to-site VPN, the process software is deployed, accessed, and executed through the use of dedicated equipment and large-scale encryption, which are used to connect a company's multiple fixed sites over a public network, such as the Internet.

The process software is transported over the VPN via tunneling, which is the process of placing an entire packet within another packet and sending it over a network. The protocol of the outer packet is understood by the network and both points, called tunnel interfaces, where the packet enters and exits the network.

Figure 14:
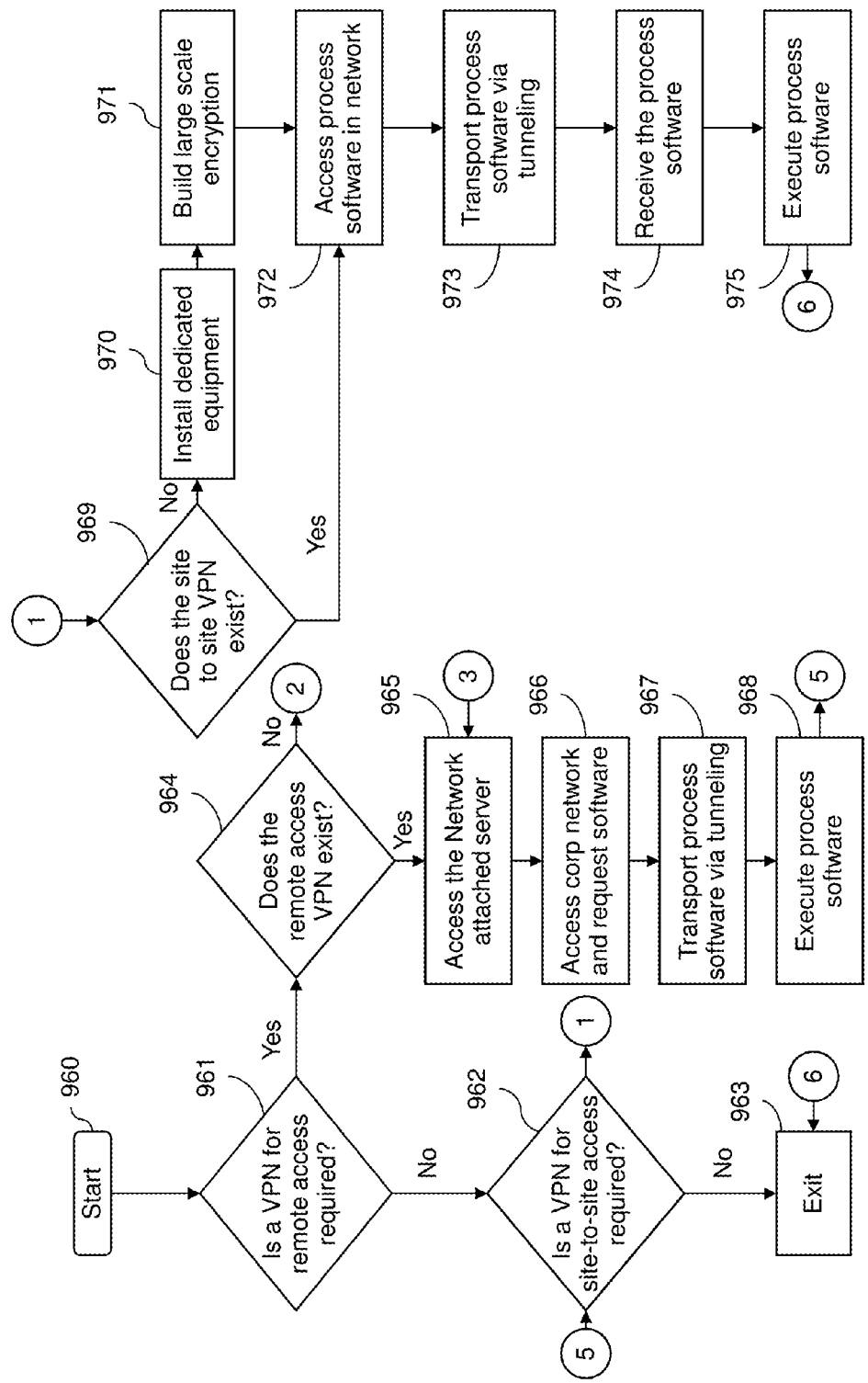
FIG. 14 is a schematic diagram of a virtual private network system according to systems and methods herein.
Figure 15:
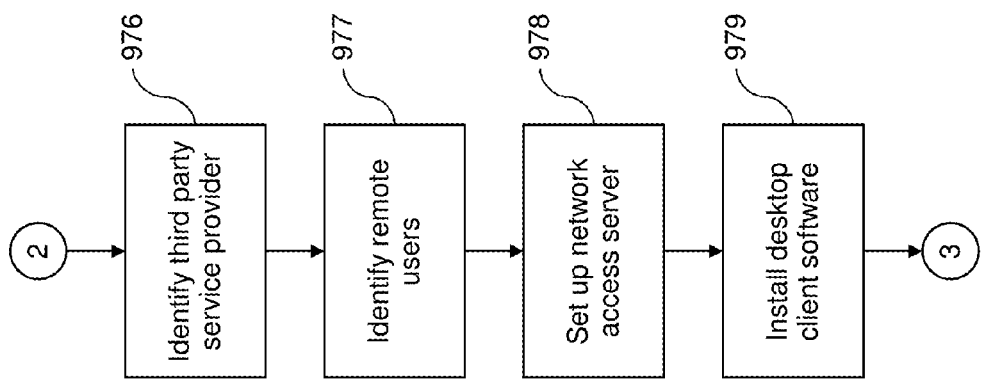
FIG. 15 is a schematic diagram of a virtual private network system according to systems and methods herein.

In FIGS. 14 and 15, step 960 begins the Virtual Private Network (VPN) process. A determination is made to see if a VPN for remote access is required 961. If it is not required, then proceed to 962. If it is required, then determine if the remote access VPN exists 964.

If it does exist, then proceed to 965. Otherwise, identify the third party provider that will provide the secure, encrypted connections between the company's private network and the company's remote users 976. The company's remote users are identified 977. The third party provider then sets up a network access server (NAS) 978 that allows the remote users to dial a toll-free number or attach directly via a cable or DSL modem to access, download, and install the desktop client software for the remote-access VPN 979.

After the remote access VPN has been built, or if it been previously installed, the remote users can then access the process software by dialing into the NAS or attaching directly via a cable or DSL modem into the NAS 965. This allows entry into the corporate network where the process software is accessed 966. The process software is transported to the remote users' desktop over the network via tunneling. That is, the process software is divided into packets and each packet, including the data and protocol, is placed within another packet 967. When the process software arrives at the remote users' desktop, it is removed from the packets, reconstituted, and executed on the remote users' desktop 968.

A determination is made to see if a VPN for site-to-site access is required 962. If it is not required, then proceed to exit the process 963. Otherwise, determine if the site-to-site VPN exists 969. If it does exist, then proceed to 972. Otherwise, install the dedicated equipment required to establish a site-to-site VPN 970. Then build the large-scale encryption into the VPN 971.

After the site-to-site VPN has been built, or if it had been previously established, the users access the process software via the VPN 972. The process software is transported to the site users over the network via tunneling 973. That is, the process software is divided into packets and each packet, including the data and protocol, is placed within another packet 974. When the process software arrives at the remote users' desktop, it is removed from the packets, reconstituted, and executed on the site users' desktop 975. Proceed to exit the process 963.

The terminology used herein is for the purpose of describing particular systems and methods only and is not intended to be limiting of this disclosure. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In addition, terms such as "right", "left", "vertical", "horizontal", "top", "bottom", "upper", "lower", "under", "below", "underlying", "over", "overlying", "parallel", "perpendicular", etc., used herein are understood to be relative locations as they are oriented and illustrated in the drawings (unless otherwise indicated). Terms such as "touching", "on", "in direct contact", "abutting", "directly adjacent to", etc., mean that at least one element physically contacts another element (without other elements separating the described elements).

The corresponding structures, materials, acts, and equivalents of all means or step plus function elements in the claims below are intended to include any structure, material, or act for performing the function in combination with other claimed elements as specifically claimed. The descriptions of the various systems and methods herein have been presented for purposes of illustration, but are not intended to be exhaustive or limited to the systems and methods disclosed. Many modifications and variations will be apparent to those of ordinary skill in the art without departing from the scope and spirit of the described systems and methods. The terminology used herein was chosen to best explain the principles of the systems and methods, the practical application or technical improvement over technologies found in the marketplace, or to enable others of ordinary skill in the art to understand the systems and methods disclosed herein.

What is claimed is:

1. An integrated circuit structure, comprising:
   a memory under repair having variable size blocks of failed memory addresses;
   a Ternary Content Addressable Memory (TCAM) comprising cells storing data values comprising ranges of addresses, said ranges of addresses corresponding to virtual addresses that, in combination with an offset value, point away from failed memory addresses in said memory under repair;
   a reduction circuit operatively connected to said TCAM, said reduction circuit producing a single output for each programmed range of said ranges of said addresses, based on a virtual address input to said TCAM;
   a priority encoder operatively connected to said reduction circuit, said priority encoder selecting a first programmed range from said reduction circuit;
   a random-access memory (RAM) operatively connected to said priority encoder, said RAM comprising cells storing data values comprising said offset value for each range of said ranges of said addresses; and
   an adder having two inputs, a first input being operatively connected to said RAM and a second input being operatively connected to a virtual address line, responsive to a virtual address being an address in one of said ranges of said addresses, said priority encoder passing said first programmed range containing said virtual address to said RAM, said RAM passing an offset value to said adder, said offset value corresponding to said first programmed range from said priority encoder, and said adder calculating a physical memory address directing said virtual address to a functional memory location in said memory under repair.

2. The integrated circuit structure according to claim 1, said memory under repair comprising one of:
   SRAM;
   DRAM;
   eDRAM;
   MRAM;
   PCM; and
   Flash.

3. The integrated circuit structure according to claim 1, contents for said TCAM and said RAM being generated separate from said integrated circuit structure.

4. The integrated circuit structure according to claim 3, said contents of said TCAM and said RAM being programmed in at power-up of said integrated circuit structure.

5. The integrated circuit structure according to claim 1, said ranges of said addresses being arranged in said TCAM in increasing order.

6. The integrated circuit structure according to claim 1, said reduction circuit comprising an OR-reduction circuit.

7. The integrated circuit structure according to claim 1, said priority encoder testing each programmed range of said ranges of said addresses and passing said first programmed range for which a next smaller range is greater-than-or-equal.

8. A computer-implemented method, comprising:
   configuring a Ternary Content Addressable Memory (TCAM) with data values comprising ranges of addresses in a memory under repair having variable size blocks of failed memory addresses, using a computerized device, said ranges of addresses corresponding to virtual addresses that, in combination with an offset value, point away from failed memory addresses in said memory under repair;
   receiving a virtual address, using said computerized device;
   applying at least a portion of said virtual address to said TCAM, using said computerized device;
   identifying a match in said TCAM indicating said virtual address being in said ranges of addresses, using said computerized device;
   producing a single output for each programmed range of said ranges of said addresses, based on said virtual address, using said computerized device;
   selecting a first programmed range from said ranges of addresses, using said computerized device;
   passing said first programmed range to a random-access memory (RAM), using said computerized device;
   outputting a corresponding offset value from said RAM as a first input to an adder, using said computerized device, said corresponding offset value corresponding to said first programmed range;
   applying said virtual address as a second input to said adder, using said computerized device; and
   mapping said virtual address to a physical address for a functional memory address in said memory under repair, using said computerized device.

9. The computer-implemented method according to claim 8, said memory under repair comprising one of:
   SRAM;
   DRAM;
   eDRAM;

MRAM;
PCM; and
Flash.

10. The computer-implemented method according to claim 8, said configuring said TCAM with data values comprising ranges of addresses comprising generating contents for said TCAM and said RAM identifying unused functional memory locations in said memory under repair.

11. The computer-implemented method according to claim 8, said ranges of said addresses being arranged in said TCAM in increasing order.

12. The computer-implemented method according to claim 8, each entry in said RAM comprising an offset value for each range of said ranges of addresses in said memory under repair.

13. The computer-implemented method according to claim 12, said mapping comprising said adder adding said offset value to said virtual address.

14. The computer-implemented method according to claim 13, further comprising:
   programming contents of said TCAM and said RAM at power-up; and
   arranging said contents of said TCAM in increasing order.

15. A system, comprising:
   a memory under repair having variable size blocks of failed memory addresses;
   a Ternary Content Addressable Memory (TCAM) comprising cells storing data values comprising ranges of addresses;
   a reduction circuit operatively connected to said TCAM;
   a priority encoder operatively connected to said reduction circuit;
   a random-access memory (RAM) operatively connected to said priority encoder, said RAM comprising cells storing data values comprising an offset value for each range of said ranges of addresses; and
   a processor that
      identifies ranges of addresses in said memory under repair, said ranges of addresses corresponding to virtual addresses that, in combination with an offset value, point away from failed memory addresses in said memory under repair,
      identifies unused functional memory locations in said memory under repair,
      receives a virtual address and produces a single output for each programmed range of said ranges of addresses, using said reduction circuit,
      selects a first programmed range from said reduction circuit, using said priority encoder, based on said virtual address,
      calculates a physical memory address in an unused functional memory location in said memory under repair for said virtual address based on said virtual address and a corresponding offset value, said corresponding offset value corresponding to said first programmed range, and
      directs said virtual address to said physical memory address in said unused functional memory location.

16. The system according to claim 15, said memory under repair comprising one of:
SRAM;
DRAM;
eDRAM;
MRAM;
PCM; and
Flash.

17. The system according to claim 15, contents of said TCAM and said RAM being programmed in at power-up of said system.

18. The system according to claim 15, said ranges of addresses being arranged in said TCAM in increasing order.

19. The system according to claim 15, said reduction circuit comprising an OR-reduction circuit.

20. The system according to claim 15, said priority encoder testing each programmed range of said ranges of addresses and passing said first programmed range for which a next smaller range is greater-than-or-equal.

* * * * *